United States Patent
Tomura et al.

[11] Patent Number: 6,088,236
[45] Date of Patent: *Jul. 11, 2000

[54] SEMICONDUCTOR DEVICE HAVING A BUMP HAVING A RUGGED SIDE

[75] Inventors: Yoshihiro Tomura, Hirakata; Yoshihiro Bessho, Higashiosaka, both of Japan

[73] Assignee: Matsushita Electric Industrial Co., Ltd., Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/878,369

[22] Filed: Jun. 18, 1997

Related U.S. Application Data

[63] Continuation of application No. 08/722,487, Sep. 27, 1996, abandoned, which is a continuation of application No. 08/433,702, May 3, 1995, abandoned, which is a division of application No. 08/188,144, Jan. 27, 1994, Pat. No. 5,545,589.

[30] Foreign Application Priority Data

Jan. 28, 1993 [JP] Japan ......................... 5-12559

[51] Int. Cl.$^7$ .............................. H01L 29/41; H01L 23/48
[52] U.S. Cl. .................. 361/783; 361/768; 361/771; 361/773; 361/774; 361/779; 257/692; 257/737; 257/739; 257/778; 174/259; 174/260; 438/108; 438/119; 438/665; 438/666; 228/180.22
[58] Field of Search .................... 174/259, 260, 174/261; 228/180.21, 180.22; 257/690, 692, 735, 737, 738, 723, 724, 700, 778, 779, 780, 783, 786, 739; 361/760, 767, 768, 771, 772, 773, 774, 777, 779, 782, 783; 438/108, 118, 119, 665, 666; 439/68, 83, 526

[56] References Cited

U.S. PATENT DOCUMENTS 3,737,986 6/1973 Cranston ................ 228/180.21
4,172,907 10/1979 Mones et al. .
4,442,966 4/1984 Jourdain et al. .................... 228/180.22
4,937,653 6/1990 Blonder et al. ......................... 257/739

FOREIGN PATENT DOCUMENTS

| 0316912 | 5/1989 | European Pat. Off. . |
| 0352020 | 1/1990 | European Pat. Off. . |
| 2-177546 | 7/1990 | Japan . |
| 3-6828 | 1/1991 | Japan ................. 257/737 |
| 3-18826 | 1/1991 | Japan . |
| 4-188657 | 7/1992 | Japan ................. 257/693 |

OTHER PUBLICATIONS

IBM Technical Disclosure Bulletin vol. 30 No. 7 Dec. 1987 pp. 208 and 205 High Strength Thermocompresson Bonds.

European Search Report (corresponding to EP 94101266).

*Primary Examiner*—Leo P. Picard
*Assistant Examiner*—John B. Vigushin
*Attorney, Agent, or Firm*—Hatner & Prestia

[57] ABSTRACT

A semiconductor unit including a circuit board having terminal electrodes on a surface thereof and a semiconductor device having an electrode pad on a first surface, where the semiconductor device is mounted face down on the surface of the circuit board. The semiconductor device has a plurality of bumps formed on the electrode pad, for electrically connecting the electrode pad to the terminal electrodes of the circuit board. Each bump includes a first bump portion and a smaller second bump portion formed on the first bump portion, and each second bump portion has a plurality of irregularities having concave portions extending in various directions. The bonding layer is formed between the second bump portion and the terminal electrode, and includes conductive particles which along with a portion of the bonding layer enter the concave portions of the plurality of irregularities of the bumps. The terminal electrodes may also have a plurality of irregularities having concave portions extending in various directions.

14 Claims, 7 Drawing Sheets

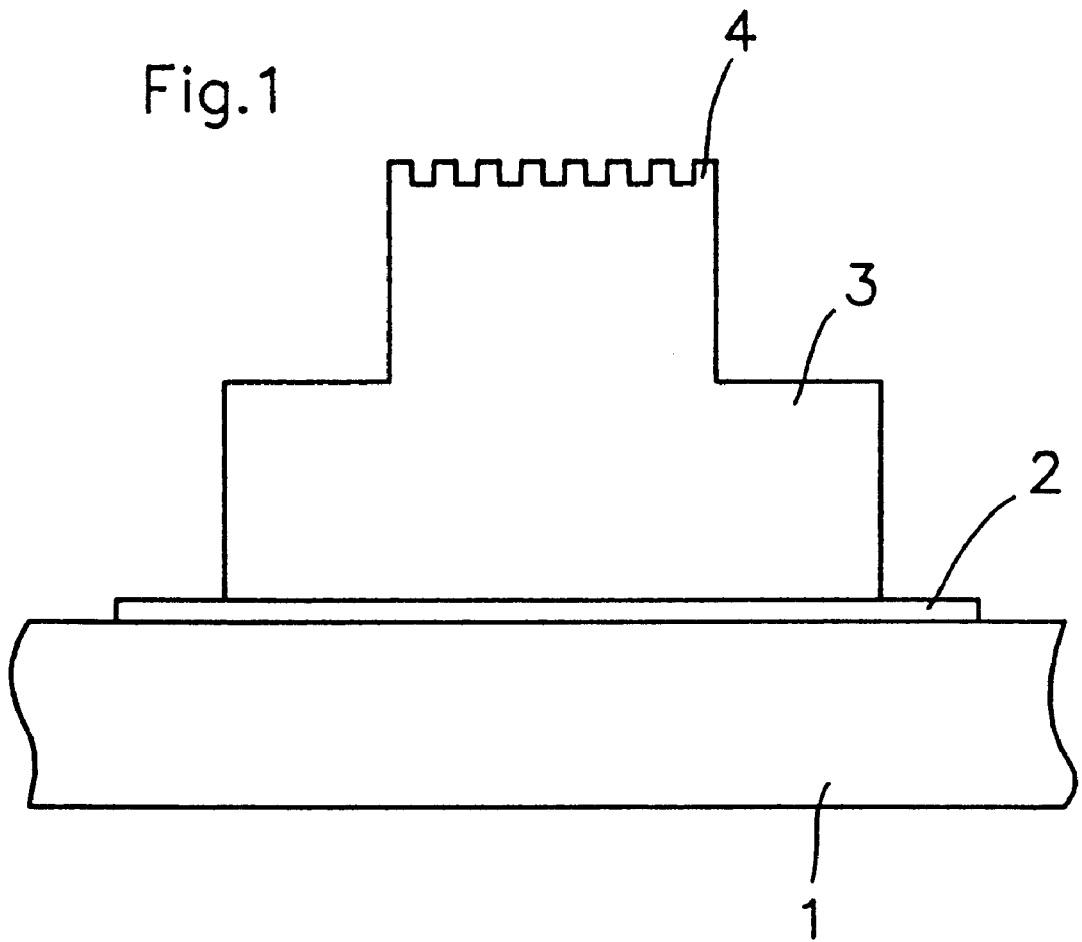

PRIOR ART

SEMICONDUCTOR DEVICE HAVING A BUMP HAVING A RUGGED SIDE

This application is a continuation of application Ser. No. 08/722,487 filed Sep. 27, 1996 now abandoned, which is a continuation of application Ser. No. 08/433,702 filed May 3, 1995 now abandoned, which is a divisional application of Ser. No. 08/188,144 filed Jan. 27, 1994, now U.S. Pat. No. 5,545,589.

BACKGROUND OF THE INVENTION

1. Field of the Invention

The invention relates to a semiconductor unit and a method for mounting a semiconductor device, and particularly to a method for forming a bump for electrically connecting a terminal electrode of a circuit board with an electrode pad of a semiconductor chip, to a method for mounting a semiconductor device using the bump, and to a semiconductor unit using the bump.

2. Description of the Related Art

Conventionally, a wire bonding method using a soldering technique has been widely used in a process for mounting a semiconductor device on a circuit board having input/output terminal electrodes. Recently, however, because the size of the package for a semiconductor device has been reduced and the number of connecting terminals has been increased, the pitch of the connecting terminals has been shortened, thereby making conventional soldering methods difficult to use for such a bonding application.

In order to solve this problem, recently, improved methods have been proposed in which a semiconductor device such as an integrated circuit chip, is directly mounted on input/output terminal electrodes of a circuit board, so that the mounting area is reduced in size, thereby improving the utility efficiency.

Among these improved methods, a flip chip bonding method in which a semiconductor device is mounted face-down on a circuit board is known to be effective because the semiconductor device is electrically connected to a large number of the terminal electrodes of the circuit board at a time with the resulting connections having excellent mechanical strength.

For example, a mounting method using a ball bonding technique is described in "IC mounting technique", edited by Nippon Microelectronics Association, KOGYO CHOSAKAI, Jan. 15, 1980. Hereinafter, this mounting method will be described.

When an electrode pad 12 of a semiconductor device (IC substrate) 11 is to be connected with an input/output terminal electrode 18 of a circuit board 19, an adhesion metal film 22 and a diffusion-preventing metal film 21 are first formed on the electrode pad 12 of the semiconductor device 11 by a vapor deposition technique as shown in FIG. 6A, and an electrical contact (projecting electrode: bump) 20 made of solder is then formed by a plating technique. Thereafter, the thus formed IC chip is positioned so that the solder bump 20 contacts with the terminal electrode 18, and then placed facedown on the circuit board 19 as shown in FIG. 6B. The semiconductor unit is then heated to a high temperature so that the solder bump 20 is fused and bonded to the terminal electrode 18 of the circuit board 19.

Recently, as shown in FIG. 7, a semiconductor unit is proposed in which an Au bump 30 is formed on an electrode pad 32 of a semiconductor device 31 by a plating technique and the Au bump 30 is connected with a terminal electrode 38 of a circuit board 39 through a conductive adhesive 37. In such a semiconductor unit, after the conductive adhesive 37 is transferred to the bump 30 of the semiconductor device 31, the positioning process is conducted in such a manner that the bump 30 contacts with the input/output terminal electrode 38 of the circuit board 39, and the conductive adhesive 37 is then cured to obtain an electrical connection.

When pitches of terminal electrodes are to be formed more finely, however, there arise the following problems in such a bump for a conventional semiconductor device, a semiconductor device or a semiconductor unit using such a bump.

1. When the solder bump 20 is heated to a high temperature (200 to 300° C.) to be fused and connected with the input/output terminal electrode 18, it is impossible to maintain the separation distance between the metal film on the surface of the IC substrate 11 and the terminal electrode 18, resulting in a danger that the fused solder spreads to reach an adjacent electrical contact or bump, thereby causing a shortcircuit.

2. The electrical contact (bump) 30 has a section shape of a trapezoid (straight wall type) or a semicircle (mushroom type). When the bump 30 is connected with the input/output terminal electrode 38 through the conductive adhesive 37, there is a risk that the conductive adhesive 37 spreads to reach an adjacent contact or bump, thereby causing a short-circuit.

3. When the bump 30 is connected with the input/output terminal electrode 38 through the conductive adhesive 37, the front end face of the bump 30 to which the conductive adhesive 37 has been transferred is pressed with a load against the terminal electrode 38 on the circuit board 39. Therefore, the most part of the conductive adhesive 37 is formed so as to surround the bump of the bonding portion (this surrounding part is referred to as a bulk portion). Consequently, when a stress due to thermal expansion caused by a thermal shock, or a reduction of the adhesion strength produces a crack or separation in the bulk portion, there is a risk that the bonding interface is made unstable so that the resistance of the electrical contact is increased.

The invention has been directed in order to solve the above-mentioned problems. It is an object of the invention to provide a method for forming a projecting electrode for a semiconductor device, a method for mounting a semiconductor device, and a semiconductor unit which enable an electrical connection with a fine pitch between the semiconductor device and a circuit board to be conducted easily and surely.

SUMMARY OF THE INVENTION

The method of forming bumps of this invention, the bumps being for connecting electrode pads of a semiconductor device to terminal electrodes formed on a surface of a circuit board respectively, the semiconductor device being mounted facedown on the surface of the circuit board, comprises: step a of forming the bumps on the electrode pad of the semiconductor device; step b of placing facedown the semiconductor device on a flat foundation so that the bumps contact with a grind sheet which is fixed to the flat foundation and which has abrasive grind; and step c of conducting ultrasonic vibration on the flat foundation while pressing the semiconductor device against the flat foundation, thereby forming a rugged side in a front end portion of each of the bumps.

A method of the invention of mounting a semiconductor device having electrode pads on a surface, on a circuit board having terminal electrodes on a surface, comprises: step a of forming bumps on the electrode pads of the semiconductor device; step b of placing facedown the semiconductor device on a flat foundation so that the bumps contact with a grind sheet which is fixed to the flat foundation and which has abrasive grind; step c of conducting ultrasonic vibration on the flat foundation while pressing the semiconductor device against the flat foundation, thereby forming a rugged side in a front end portion of each of the bumps; step d of applying a conductive adhesive material to the front end portion of each of the bumps in which a rugged side is formed; step e of facedown mounting the semiconductor device on the circuit board so that the bumps contact with the terminal electrodes; and step f of curing the conductive adhesive material to form a bonding layer.

In one embodiment of the invention, step c includes a step of leveling the bumps to make the bumps a uniform height, the bumps being leveled when the semiconductor device is pressed against the flat foundation.

In another embodiment of the invention, the bumps are made of a material selected from the group consisting of Au, Cu, Al, solder, or an alloy of these metals.

In still another embodiment of the invention, the bumps are formed on the electrode pads by a ball bonding method in step a.

In still another embodiment of the invention, the bumps are formed by a soldering method or a plating method in step a.

In still another embodiment of the invention, the bonding layer is made of a conductive adhesive.

In still another embodiment of the invention, the bonding layer is made of an anisotropic conductive material.

In still another embodiment of the invention, the method includes a step of forming another rugged side at least in a portion of a surface of each of the terminal electrodes.

A semiconductor unit according to the present invention comprises: a circuit board having terminal electrodes on a surface; and a semiconductor device having an electrode pad on a surface, the semiconductor device being mounted facedown on the surface of the circuit board, a bump for electrically connecting the electrode pad to the terminal electrodes of the circuit board being formed on the electrode pad, wherein the bump has a rugged side in a front end portion, the terminal electrode has another rugged side formed at least in a portion of a surface of the terminal electrodes, and a bonding layer is formed between the front end portion of the bump and the portion of the surface of the terminal electrodes.

In one embodiment of the invention, the bumps are made of a material selected from the group consisting of Au, Cu, Al, solder, or an alloy of these metals.

In another embodiment of the invention, the bonding layer is made of a conductive adhesive.

In still another embodiment of the invention, the bonding layer is made of an anisotropic conductive material.

Thus, the invention described herein makes possible the advantages of (1) providing a method for forming a projecting electrode (bump) for a semiconductor device, (2) providing a method for mounting a semiconductor device,, and (3) providing a semiconductor unit which enables an electrical connection with a fine pitch between the semiconductor device and a circuit board to be conducted easily and surely.

These and other advantages of the present invention will become apparent to those skilled in the art upon reading and understanding the following detailed description with reference to the accompanying Figures.

BRIEF DESCRIPTION OF THE DRAWINGS

FIG. 1 is a schematic front view of an electrical contact of a semiconductor device of an embodiment of the invention.

DESCRIPTION OF THE PREFERRED EMBODIMENTS

Figure 2A:
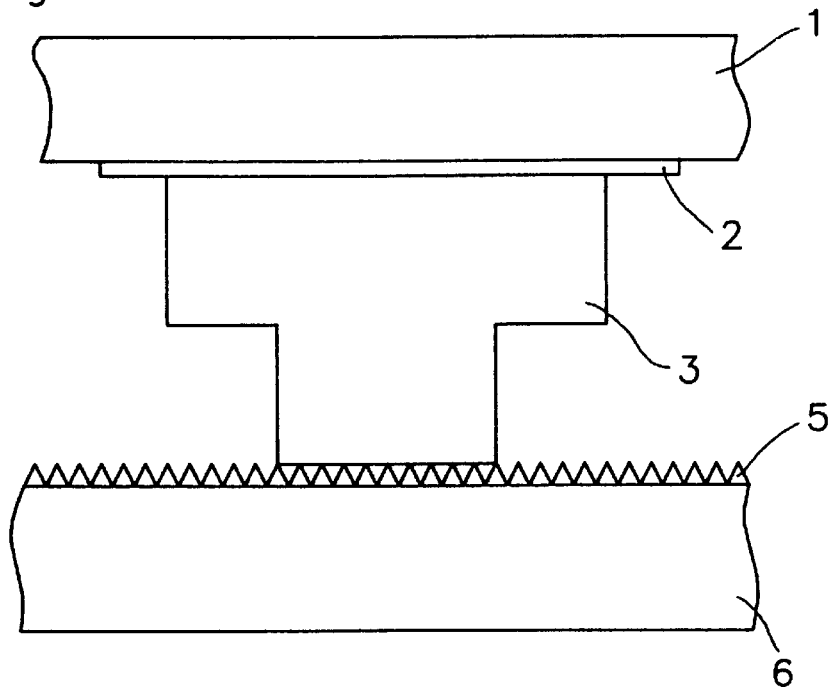
FIG. 2A is a schematic view illustrating a method of forming an electrical contact of a semiconductor device of the embodiment of the invention.

Hereinafter, the invention will be described by illustrating examples.

EXAMPLE 1

FIG. 1 shows one of a plurality of electrical contacts formed in a part of a semiconductor device according to the invention. Electrode pads 2 are formed on an IC substrate 1, and projecting electrodes (bumps) 3 are formed on the electrode pads 2, respectively. A pair of one of the bumps 3 and one of the electrode pads 2 is shown in FIG. 1. A rugged side 4 is formed in a front end portion of each bump 3. In the specification, the term "rugged side" means a side having a surface which is roughed by forming a number of grooves of a width of 0.1 to 10 $\mu$m in various directions. In Example 1, as shown in Fig. 1, each bump 3 comprises a first bump portion and a similiar second bump portion which is formed thereon, so as to have a two-stage projecting shape. The shape of the bumps 3 is not restricted to such a two-stage projecting shape, and a single-stage shaped bump may be used.

Hereinafter, a method for forming the bumps 3 having the rugged side 4 will be described.

At first, the bump 3 is formed on the electrode pad 2 of the IC substrate 1. For example, the bump 3 may be formed with a conventional ball bonding method. A metal wire for the ball bonding may be made of a material which can fuse to form an alloy with the material of the electrode pad 2 of the IC substrate. An example of the material of the metal wire Au, Cu, Al, or an alloy of these metals. The size and material of the metal wire can be adequately selected in accordance with objects such as the outer diameter and height of the bumps to be formed. Although a ball bonding methods is employed in Example 1, the formation of bumps may be conducted by using another method such as an electrolytic plating method, a solder bath immersion method, or a vapor deposition method.

Figure 2B:
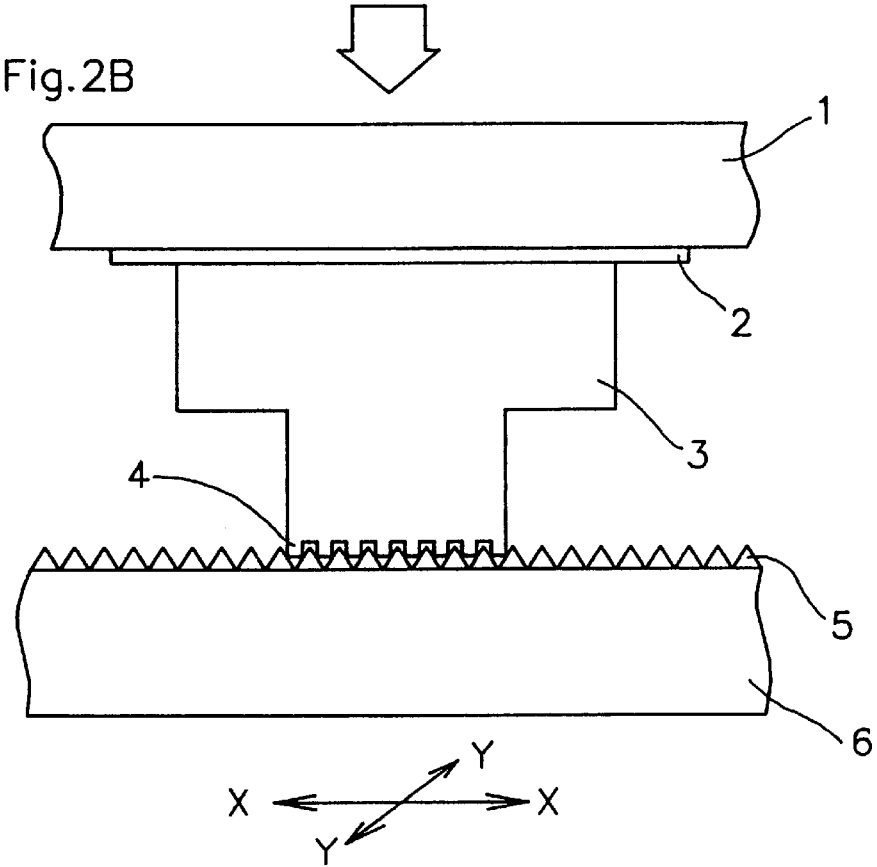
FIG. 2B is a schematic partial section view of a semiconductor unit in which the semiconductor device is mounted on a circuit board.

FIGS. 2A and 2B show a method for forming the rugged side 4 in the front end portion of the thus formed bump 3. As shown in FIG. 2A, the semiconductor device on which the bump 3 is formed is placed on a flat foundation 6 directing it facedown. A grind sheet 5 having abrasive grind is fixed to the surface of the flat foundation 6. The flat foundation 6 incorporates therein an ultrasonic oscillator (not shown), and can be moved in an X-Y plane as shown in FIG. 2B.

Preferably, the abrasive grind of the grind sheet 5 is made of a hard material having wear resistance, and strongly adheres to the sheet or is embedded therein, in order that the abrasive grind on the sheet is prevented from being abraded in the step of rubbing the front end portion of each bump with the abrasive grind and no abrasion powder adheres to the front end portion of the bump. For example, a grind sheet having diamond abrasive may be used. Even when the hardness of the abrasive grind is lower than that of diamond, there arises no problem in the formation of the rugged side as far as the abrasive grind has an excellent antiabrasion property against the material of the bumps.

The grind sheet 5 may be adequately selected from a wide range of grind sheets in accordance with the material of the bumps, hardness of the bumps and the size of the conductive particles included in the conductive adhesive. For example, abrasive grind of the polishing sheet may be made of silicon carbide (SiC), chromium oxide ($Cr_2O_3$), or the like. The size and roughness of the abrasive grind may be selected from the range of 8 to 0.3 $\mu m\phi$, and that of NO. 2,000 to 10,000 mesh, respectively.

Then, while the semiconductor device is pressed against the flat foundation 6 as shown in FIG. 2B, the ultrasonic oscillator incorporated in the flat foundation 6 is operated so that the flat foundation 6 vibrates in the X-Y plane. The pressing direction of the semiconductor device is vertical to the X-Y plane. The pressing of the semiconductor device makes the heights of the bumps 3 uniform (or levels of the bumps), and the vibration of the flat foundation 6 forms the rugged side 4 in the front end portion of each bump 3. The vibration directions may be set to be any suitable ones as far as they are in the X-Y plane. The strength of the pressing of the semiconductor device against the flat foundation 6 is selected in accordance with the material of the bumps. In the case of Au bumps, for example, it is set to be 50 g per one bump.

As described above, since the rugged side 4 is formed at the same time to level the bumps, the rugged side 4 can be formed without adding an additional step to the fabricating process. However, the method of forming the rugged side according to the invention can apply to any bump which is formed without a particular leveling step.

Further, an oxidized surface or impurities on the front end portion can be removed by conducting the step of forming the rugged side in the front end portion of each bump immediately before the step of mounting the semiconductor device on the circuit board, thereby realizing a more highly reliable electric connection and adhesion of a semiconductor device and a circuit board.

Although the abrasive grind is illustrated 90 as to have a sharp tip in FIGS. 2A and 2B, it is not required for the abrasive grind to have a sharp tip as far as the abrasive grind has a shape which is selected in due consideration of the size of the conductive particles of the conductive adhesive 7. The grind sheet 5 can be replaced with a new one according to the abrasion condition of the abrasive grind. Alternatively, the grind sheet 5 may be shifted on the flat foundation 6 and a new portion of the grind sheet 5 can be used for forming the rugged side 4 in the front end portion of the bump.

Figure 3A:
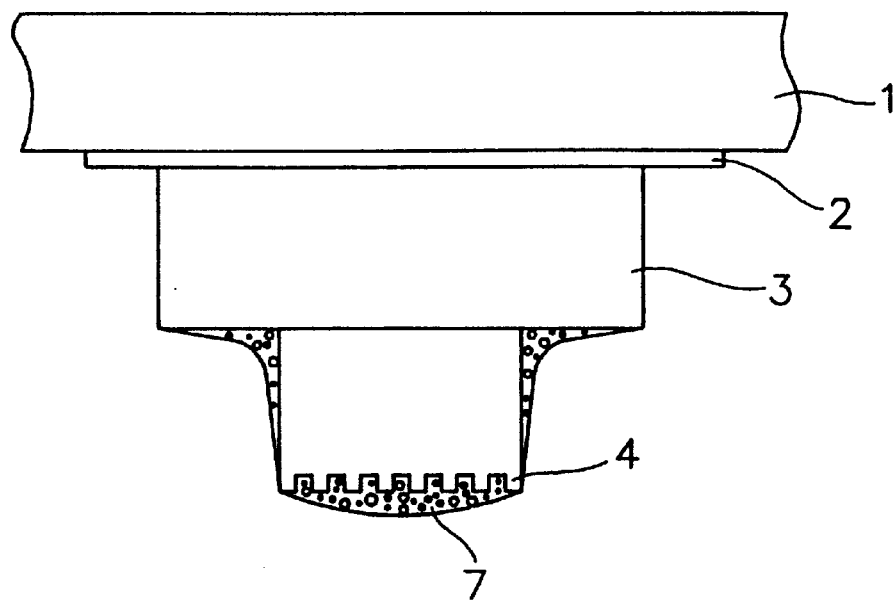
FIG. 3A is a schematic view illustrating a method of forming a bonding layer made of a conductive adhesive in the front end of an electrical contact of a semiconductor device of the embodiment of the invention.

Then, as shown in FIG. 3A, the conductive adhesive 7 is applied, using a transfer method or a printing method, to the rugged side 4 which is formed in the above step in the front end portion of each bump 3 of the semiconductor device. In Example 1, the bump 3 having a two-stage projecting shape is used in order to more effectively restrain the conductive adhesive (bonding layer) 7 from spreading. The use of the bump 3 having a two-stage projecting shape can prevent an excess amount of the conductive adhesive 7 from adhering to the bump 3, or allow an adequate amount of the conductive adhesive 7 to be applied to the bump 3. However, the shape of the bump 3 is not particularly restricted as far as the rugged side 4 is formed in the front end portion of the bump.

In Example 1, the bonding layer 7 is formed by a transfer method or a printing method in which the conductive adhesive 7 is applied to the rugged side 4 formed in the front end portion of each bump 3. The bonding layer 7 may be formed by another method. For example, the bonding layer 7 may be formed by applying the conductive adhesive 7 to terminal electrodes 8 of a circuit board 9 in place of the front end portions of the bumps 3.

As the conductive particles included in the conductive adhesive 7, a material such as AgPd, Au, Cu, Ag, and a composite conductive material may be used. Preferably, the conductive particles are made of a material which has a good resistance to oxidation and moisture and has a low volume specific resistivity. The average size of the conductive particles is about 1 $\mu$m.

Figure 3B:
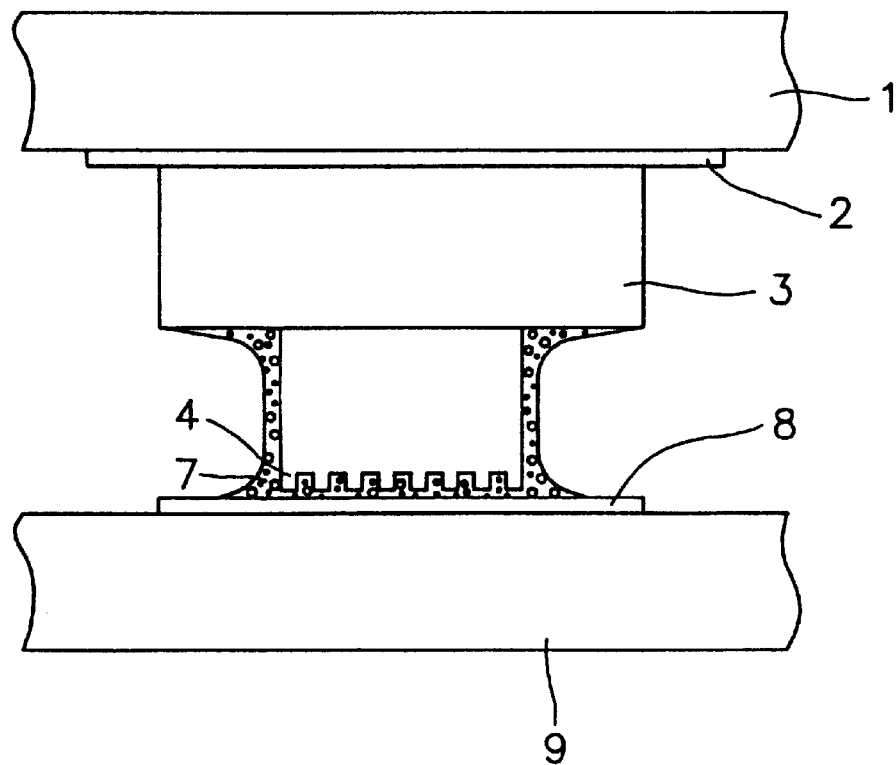
FIG. 3B is a schematic partial section view of a semiconductor unit in which the semiconductor device is mounted on a circuit board.

After the application of the conductive adhesive 7, the semiconductor device is mounted face-down on the circuit board 9 as shown In FIG. 3B. The positioning step is conducted so that the bumps 3 contact with a predetermined position of the respective is input/output terminal electrodes 8 of the circuit board 9. Thereafter, the conductive adhesive 7 is thermoset at 80 to 150° C. to form the bonding layer 7, whereby the bumps 3 of the semiconductor device are electrically bonded with the terminal electrodes 8 on the circuit board 9, respectively. As a result, the semiconductor device is mounted on the circuit board to obtain a semiconductor unit.

According to Example 1, the bumps 3 made of a material such as Au are formed on the electrode pads 2 of the semiconductor device, and therefore the existence of the bumps which do not fuse at a low soldering temperature can keep the IC substrate 1 and the circuit board 9 separated from each other by a fixed distance.

In the step of bonding the bumps 3 of the semiconductor device with the terminal electrodes 8 of the circuit board 9 through the bonding layer 7 consisting of the conductive adhesive, an adequate amount of the conductive adhesive 7 can be transferred or printed to the rugged side 4 in the front end of each bump 3. Therefore, the conductive adhesive 7 is prevented from spreading, thereby eliminating the risk of a shortcircuit between the conductive adhesive 7 and an adjacent bump. In the step of pressing the semiconductor device, the conductive adhesive 7 is kept in the rugged portions, whereby the conductive adhesive 7 is prevented from spreading to the periphery. These features enable an electrical connection of a fine pitch to be conducted.

Since the rugged side 4 is formed in the front end portion of each bump 3, the conductive particles and the resin of the conductive adhesive 7 enter concaved portions so that the adhesion area is widened. Consequently, the probability that the conductive particles contact with the surface of the respective bumps is enhanced, and the adhesion strength exerted on the input/output terminal electrodes 8 is increased, thereby obtaining a mounting body for a semiconductor in which an electrical connection and an adhesion can be conducted with a highly reliable manner.

Therefore, the formation of the rugged side 4 in the front end portion of each bump can effectively restrict the spread of the bonding layer (conductive adhesive layer) which cannot be restricted in the configuration of electrical contacts in the conventional manner. This can suppress the formation of bulk portions, thereby solving the problem of deterioration of bulk portions which may be caused by a thermal shock, thermal expansion, or moisture absorption.

In the leveling step in which the bumps 3 of the semiconductor device are pressed on the flat face (flat foundation 6) so as to make the heights of the bumps uniform, the rugged side 4 is formed. Therefore, the formation of the rugged side 4 which can improve the reliability of the electrical connection of the bumps can be conducted without increasing the number of production steps.

The method of the invention forming the rugged side 4 in the front end portion of the bump 3 by ultrasonic vibration on the flat foundation 9 having the grind sheet 5 has many advantages.

First, the method of the invention has desirable effects which could not be obtained from a method in which a rugged side is formed by simply pressing the bump. For example, comparing a conventional method in which a rugged side is formed in a leveling step by simply pressing the bumps against a flat member which has a rugged face, the method of the invention can form a more finely rugged side. Simply pressing the bump against the rugged face can not form a finely rugged side.

If the rugged side is formed by simply pressing the bump, the bump should be soft enough and a pressing force should be strong enough to form the rugged side.

Accordingly, the simply pressing method is limited to applicable conditions and it is difficult to apply to bumps which are formed without the leveling step. However, the method of the invention can form the rugged side without a strong pressing force and is widely applicable to various bumps which are formed without the leveling step, because the invention using the method of vibrating the flat foundation having a grind sheet.

Second, the method of the invention can form the rugged side in the front end portion of a bump of various material and hardness by selecting the appropriate grind sheet with a suitable hardness of the grind particles according to the hardness of the material of the bump. The method of the invention also can easily adjust the mesh size of the rugged side according to the size of the conductive particles included in the conductive adhesive by choosing the appropriate size of the grind particle of the grind sheet.

Moreover, since the surface of the front end portion of the bump is ground off and a new surface is exposed when the rugged side 4 is formed in the front end portion, oxidized surfaces or impurities on the front end portion can be removed away by conducting the step of forming the rugged side 4 in the front end Portion of each bump 3. By conducting the step of forming the rugged side 4 immediately before the step of mounting the semiconductor device on the terminal electrodes 8 of the circuit board 9, a semiconductor mounting which is highly reliable in electrical connection and adhesion strength is realized. In particular, when the bump is made of a base metal which is easily oxidizable, the method of the invention has a great advantage in electrical connection. Such an advantage is never obtain from the simply pressing method of forming the rugged side.

Further, the method of the invention can easily form the rugged side without additional steps. Because of using the grind sheet for forming the rugged side, it is easy to use a new grind sheet or a new portion of the grind sheet for forming the rugged side for a new bump by changing or shifting the grind sheet on the flat foundation. Accordingly, absorption or blowing away of the ground dust is unnecessary. The grind sheet is easily changed. On the other hand, in the simply pressing method of forming a rugged side, the flat member having the rugged face is to be changed or washed. Changing the flat member is not easier than changing the grind sheet and washing the flat member requires additional steps of fabrication.

EXAMPLE 2

Figure 4A:
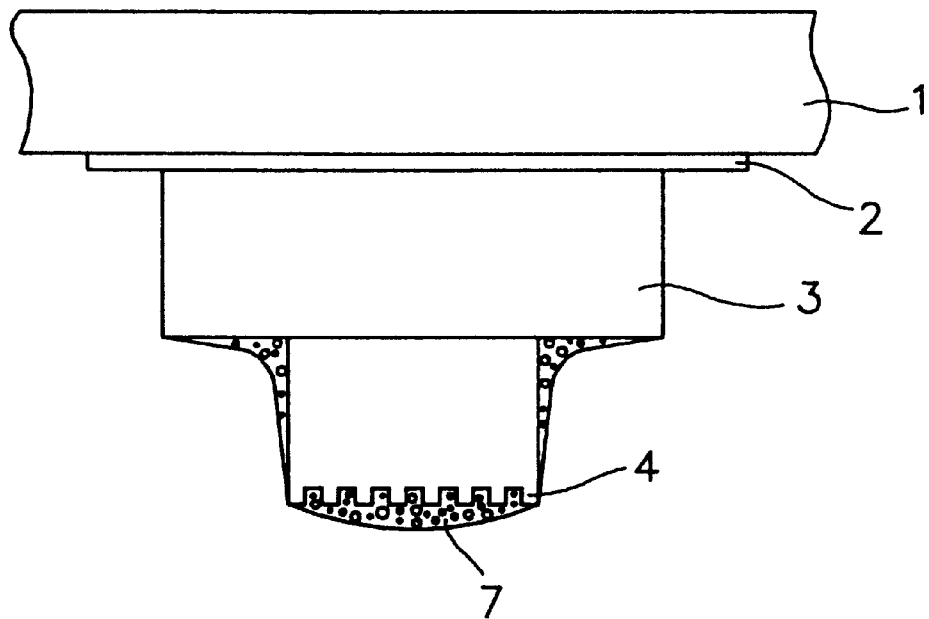
FIG. 4A is a schematic view illustrating a method of forming a bonding layer made of a conductive adhesive in the front end of an electrical contact of a semiconductor device of another embodiment of the invention.
Figure 4B:
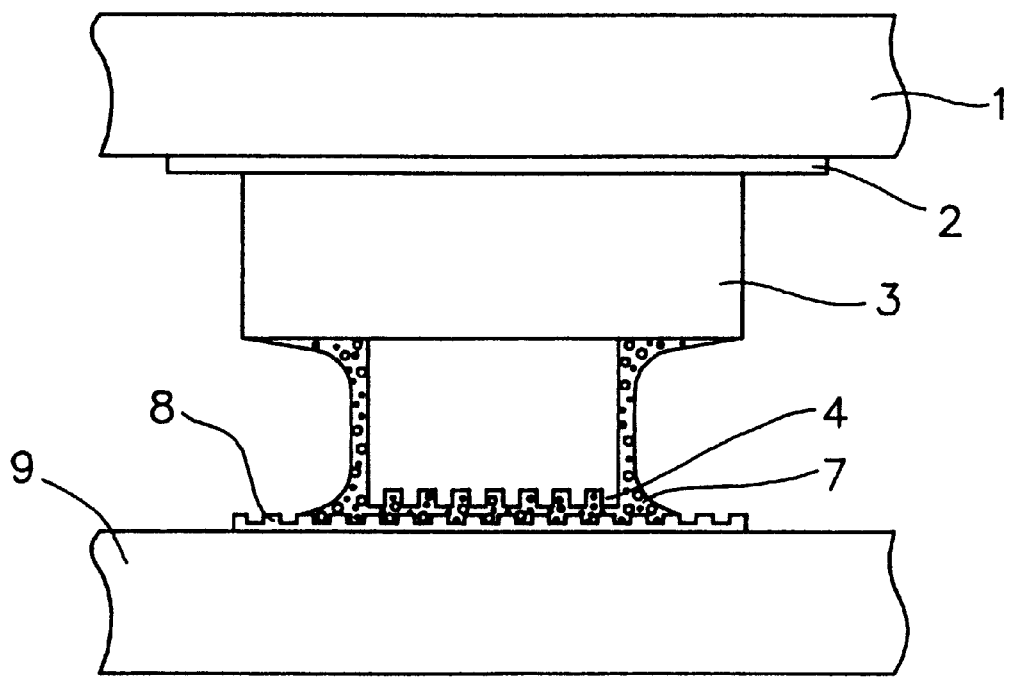
FIG. 4B is a schematic partial section view of a semiconductor unit in which the semiconductor device is mounted on a circuit board.

FIGS. 4A and 4B show a second example of the invention. In the figures, components identical with those of the first example are indicated by the same reference numerals. The electrode pads 2 are formed on the IC substrate 1, and the bumps 3 are formed on the electrode pads. A rugged side 4 is formed in the front end portion of each bump 3. In the figures, only one set of the electrode pad 2, the bump 3, and the rugged side 4 is shown. In Example 2, the bumps 3 have the same two-stage projecting shape as those of the first example, but the shape of the bumps 3 are not restricted to this. The bumps 3 are formed and mounted in the same manner as those of the first example. A conductive adhesive 7 is applied to the front end portion of each bump 3, and a semiconductor device is mounted facedown on the circuit board 9. Then, while pressing the semiconductor device, the conductive adhesive 7 is thermoset to respectively connect the bumps 3 with terminal electrodes 8.

In Example 2, as shown in FIG. 4B, the rugged side is formed not only in the front end portion of each bump 3 but also another rugged side is formed on the surface of each terminal electrode B of the circuit board 9. After the formation of the terminal electrodes 8, the rugged side may be formed on the surface of each terminal electrode 8 by the method of using a grind sheet in the same manner as Example 1. The rugged side may be formed by another surface processing technique. The groove width of the rugged side formed on the surface of each terminal electrode 8 ranges from about 1 to 10 μm.

Since both the front end portion of each bump 3 and each terminal electrode 8 are provided with the rugged side, the adhesion area of the conductive adhesive 7 can be widened so that the adhesion strength is enhanced. Furthermore, the conductive particles of the conductive adhesive 7 can enter concaved portions formed on both the front end portion of each bump 3 and the surface of each terminal electrode 8, and therefore the electrical conductivity can be obtained more surely. Consequently, a mounting body for a semiconductor in which an electrical connection and an adhesion can be conducted in a highly reliable manner is obtained.

EXAMPLE 3

When the bonding layer 7 is formed by using the conductive adhesive 7, the adhesive 7 may reach the electrode pad 2 of the IC substrate I depending on the shape of the bumps 3, so that the adhesive may be shortcircuited with an adjacent bump or electric contact. In such a case, the use of an anisotropic conductive material in which the solvent and resin do not stretch can eliminate such a risk of shortcircuit.

Figure 5A:
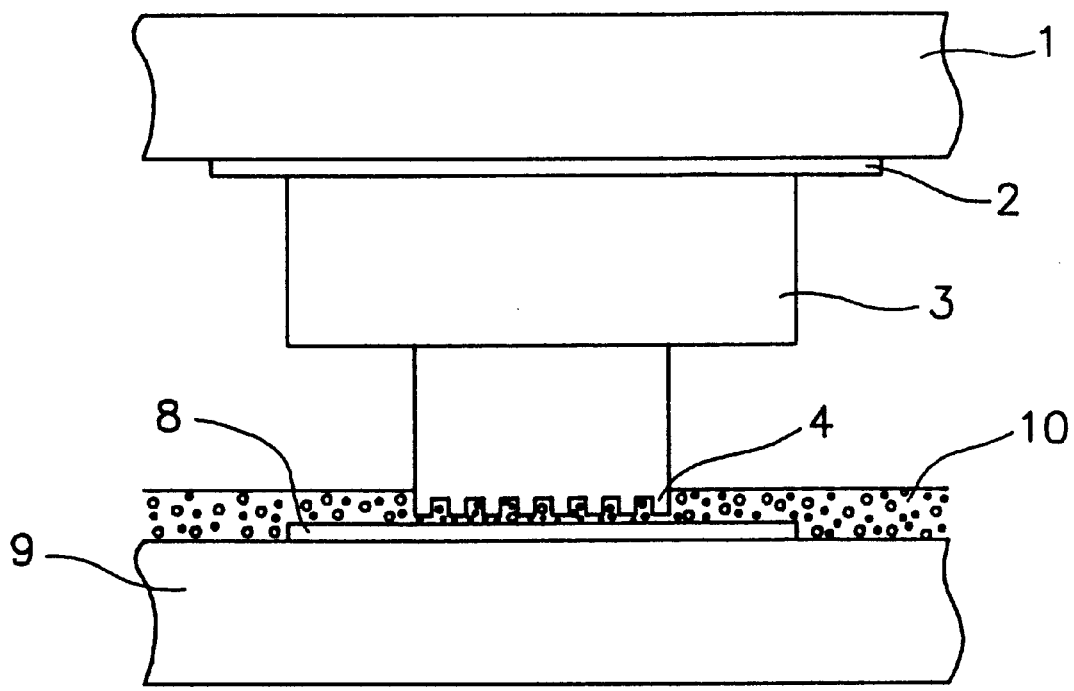
FIGS. 5A and 5B are schematic partial section views of semiconductor units of further embodiments of the invention.
Figure 5B:
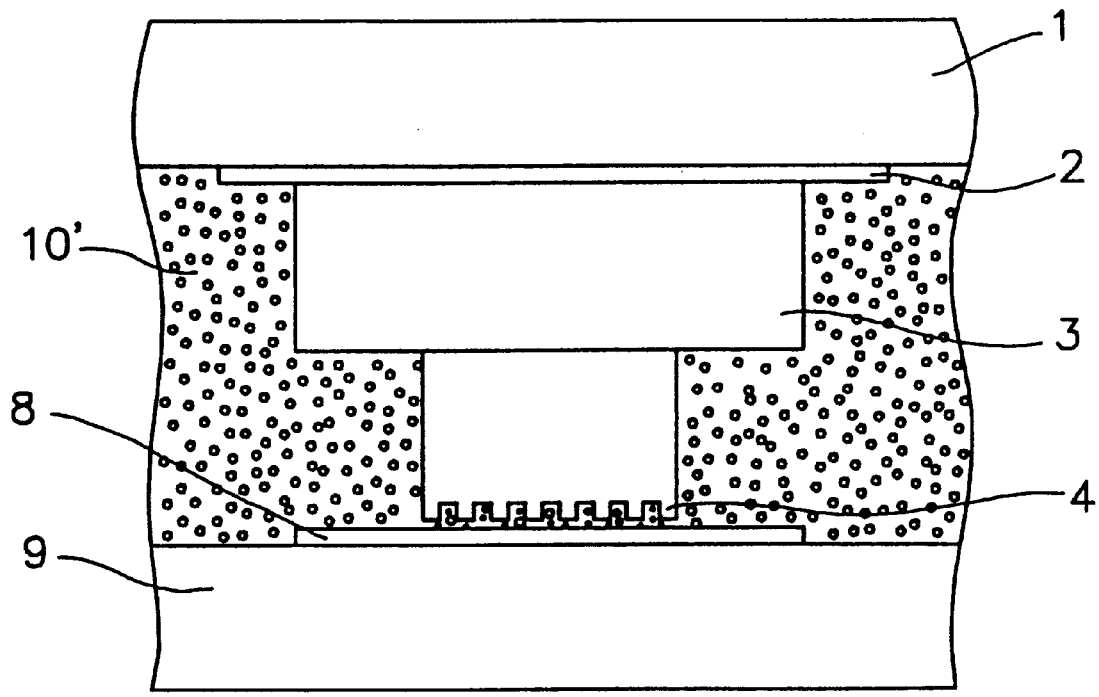
Figure 6A:
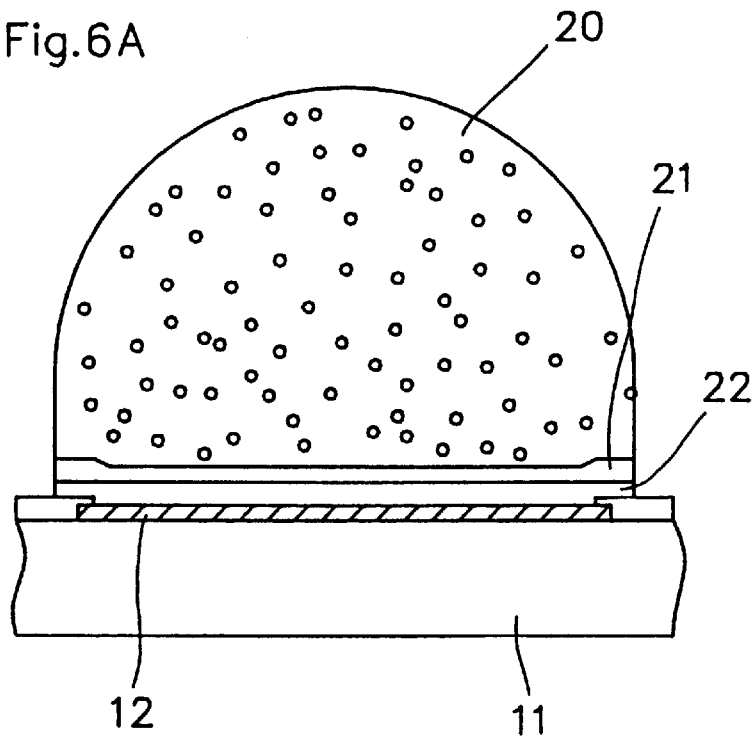
FIG. 6A is a schematic section view of a solder bump of a conventional semiconductor device.
Figure 6B:
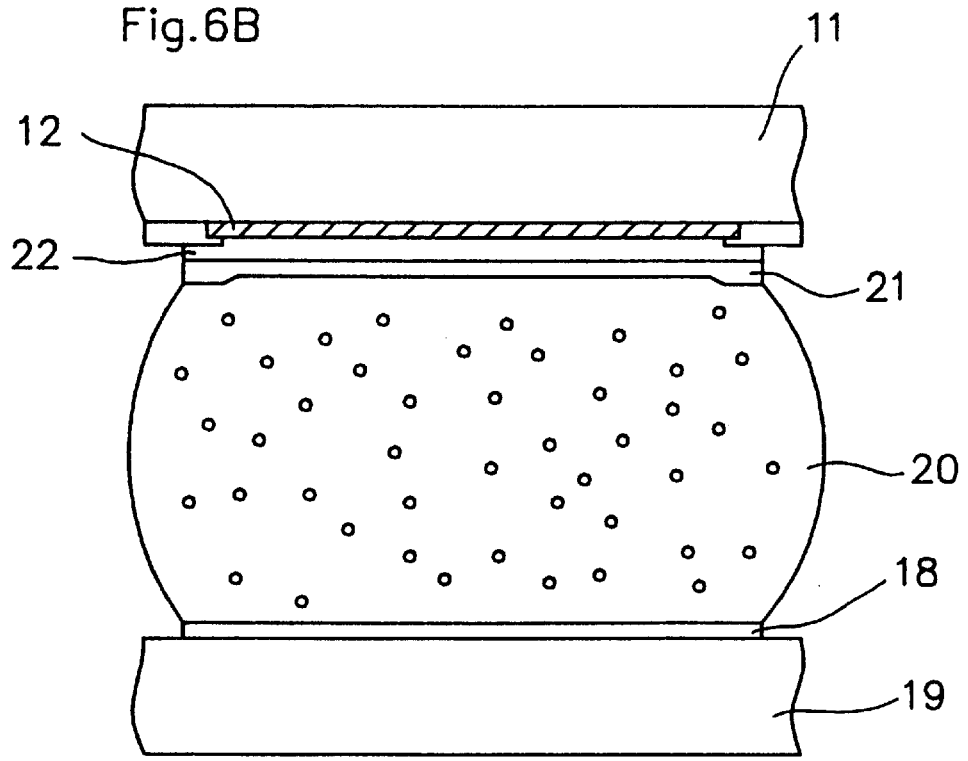
FIG. 6B is a schematic section view of a conventional semiconductor unit.
Figure 7:
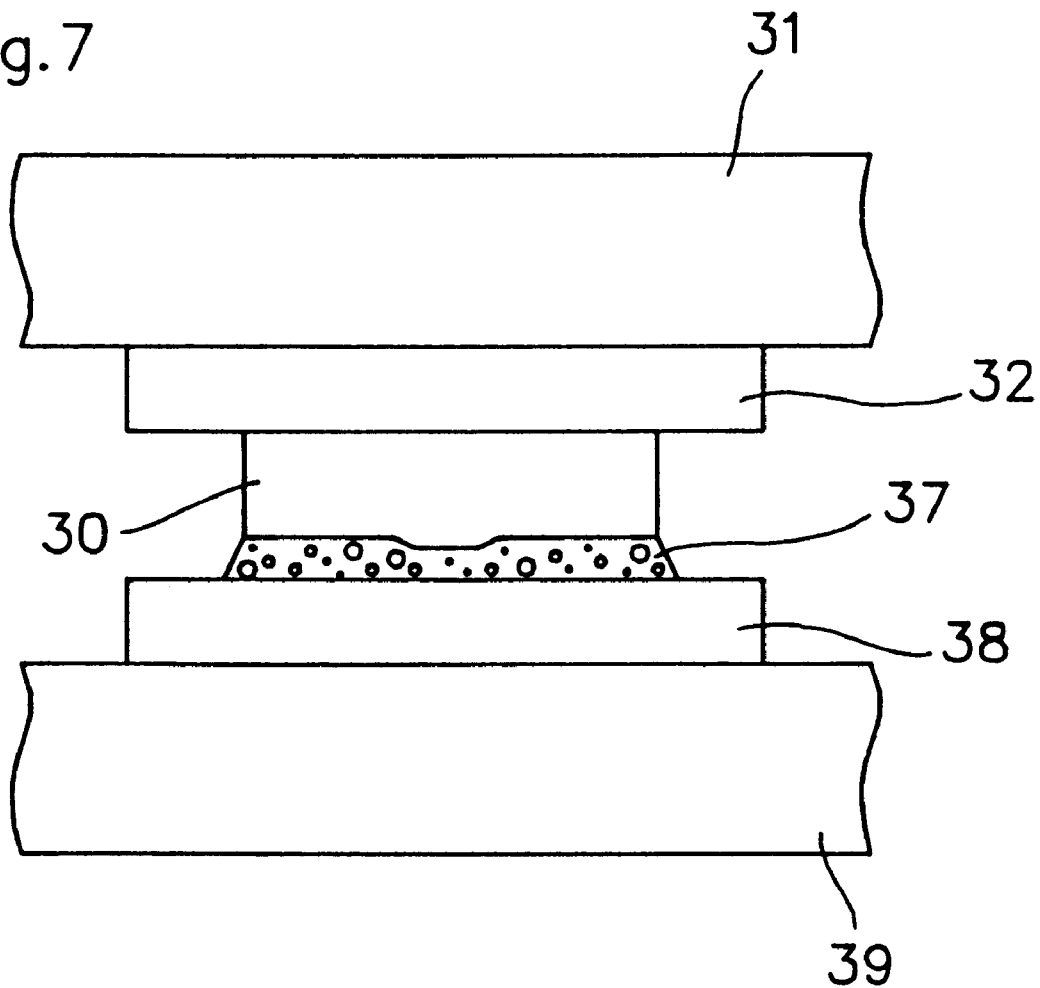
FIG. 7 is a schematic section view of another conventional semiconductor unit which uses a conductive adhesive.

A semiconductor unit in which such an anisotropic conductive material is used is shown in FIGS. 5A and 5B. The components identical with those of Examples 1 and 2 are indicated by the same reference numerals. Also in Example 3, the bumps 3 have the same two-stage projecting shape as those of Examples 1 and 2, but the shape of the bumps 3 is not restricted to this. The bumps 3 and the rugged side 4 in the front end portion of each bump 3 are formed in the same manner as Examples 1 and 2.

FIG. 5A shows a semiconductor unit according to Example 3. In FIG. 5A, a thin anisotropic conductive material 10 is disposed on the terminal electrode 8 formed on the circuit board 9. A semiconductor device on which the bump 3 having the rugged side 4 is formed is placed facedown on the anisotropic conductive material 10. The semiconductor device is heated while being pressed against the circuit board 9, so that the portion of the anisotropic conductive material 10 which is sandwiched between the bump 3 and the terminal electrode B is subjected to thermocompression bonding, thereby attaining an electrical connection.

In the portion of the anisotropic conductive material 10 which is to be subjected to thermocompression bonding, conductive particles included in the anisotropic conductive material 10 are pressed against the bump 3 to be bonded with each other, and are forcedly entered into the surface of the terminal electrode 8, thereby achieving electrical connection between the bump 3 and the terminal electrode 8. In the other portion which is not subject to the compression bonding, conductive particles are separated from each other, and therefore the electrical insulation is maintained. Since the rugged side 4 is formed in the front end portion of each bump 3, the total surface area of conductive particles which contact with the bump 3 is widened so as to improve the electrical connection. Moreover, the formation of the rugged side 4 widens the adhesion area between the bump and the resin of the anisotropic conductive material 10, so as to enhance the adhesion strength, thereby achieving an electrical connection and adhesion of further improved reliability.

The conductive particles in the anisotropic conductive material have a size of from about 1 to about 10 μm. In order to effectively attain the electrical contact, the size of the roughness of the rugged side 4 formed in the bump front end portion, and that of the conductive particles must be suitably selected.

FIG. 5B shows a semiconductor unit using an anisotropic conductive material 10' which has a thickness greater than the sum of the height of the bump 3 and the thickness of the terminal electrode 8. The thick anisotropic conductive material 10' is disposed on each of the terminal electrodes 8 formed on the circuit board 9. A semiconductor device on which the bumps 3 having the rugged side 4 are formed is placed facedown on the anisotropic conductive material.

The semiconductor device is heated while being pressed against the circuit board 9, so that the portion of the anisotropic conductive material 10' which is sandwiched between the bump 3 and the terminal electrode 8 is subjected to thermocompression bonding, thereby attaining an electrical connection. Also in this case, only the portion which is sandwiched between the bump 3 and the terminal electrode 8 is compression-bonded, and in the other portion the electrical insulation is maintained. The portion of the anisotropic conductive material 10' other than that which is subject to compression bonding functions as an insulative adhesive, and the resin in the portion is thermoset so that the semiconductor device is bonded to the circuit board. Since the rugged side 4 is formed in the front end portion of each bump 3, the total surface area of conductive particles which contact with the bump 3 is widened so as to improve the electrical conductivity.

According to the invention, without restricting the configuration of a bump and the production method to special ones, a rugged side can easily be formed in the front end portion of the bump which is formed by a method such as a ball bonding method, or a plating method. Consequently, in practical use, the invention can be applied to a very wide variety of uses.

Further, according to the invention, the rugged side is formed more finely than the rugged side formed by simply pressing the bump.

According to the invention, the rugged side can be easily formed without additional steps by using the grind sheet. When the step of forming the rugged side in the front and portion of each bump is conducted concurrently with that of leveling the bumps, it is not required to increase the number of the fabrication steps.

Since the rugged side is formed in the front end portion of each bump of a semiconductor device, the bonding surface area in the interface between the bump and a terminal electrode of a circuit board can be widened so that the electrical conductivity is improved. This enables the adhesion strength to be improved, and a highly reliable electrical connection to be obtained.

Since the rugged side is formed in the front end portion of each bump, an adequate amount of a conductive adhesive can be supplied to the interface, and the conductive adhesive can be prevented from spreading. Accordingly, during a pressing step, the conductive adhesive can be prevented from being short-circuited with an adjacent bump or circuit wiring, thereby obtaining a mounting body for a semiconductor in which an electrical connection of a fine pitch can be conducted in a highly reliable manner.

The formation of bulk portions can be suppressed by preventing the conductive adhesive from spreading, and therefore deterioration of the bonding portions which may be caused by a thermal shock, thermal expansion, or moisture absorption can be eliminated, so that a semiconductor device having excellent properties against thermal shock, thermal expansion, and moisture absorption can be mounted.

Moreover, an oxidized surface and impurities on the front end portion can be removed by conducting the step of forming the rugged side in the front end portion of each bump immediately before the step of mounting the semiconductor device on the circuit board, thereby realizing a more highly reliable mounting of a semiconductor device or a circuit board.

Further, since both the front end portion of each bump and each terminal electrode are provided with the rugged side, the electrical conductivity and the adhesion can be obtained more surely.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor unit comprising:

a circuit board having terminal electrodes on a surface; and a semiconductor device having an electrode pad on a first surface, said semiconductor device being mounted facedown on said surface of said circuit board, a plurality of bumps for electrically connecting said electrode pad to said terminal electrodes of said circuit board being formed on said electrode pad, wherein:

each of said bumps comprises a first bump portion and a smaller second bump portion which is formed on said first bump portion and has a second surface, so as to have a two-stage projecting shape, each of said bumps has a plurality of irregularities having concave portions extending in various directions defined on said second surface of said second bump portion, a bonding layer is formed between said second bump portion and said terminal electrode;

wherein said bonding layer includes conductive particles, and the conductive particles and a part of the bonding layer enter said concave portions of the plurality of irregularities of the bumps.

2. A semiconductor unit according to claim 1, wherein said bumps are made of a material selected from the group consisting of Au, Cu, Al, solder, or an alloy of these metals.

3. A semiconductor unit according to claim 1, wherein said bonding layer is made of a conductive adhesive.

4. A semiconductor unit according to claim 1, wherein said bonding layer is made of an anisotropic conductive material.

5. A semiconductor unit according to claim 1, wherein said plurality of irregularities on said bumps have a width of 0.1 to 10 $\mu$m.

6. A semiconductor unit according to claim 1, wherein said bonding layer is made of a conductive adhesive, and said conductive adhesive comprises conductive particles having an average size of about 1 $\mu$m.

7. A semiconductor unit according to claim 6, wherein said conductive particles are made of at least one conductive material selected from the group consisting of AgPd, Au, Cu, and Ag.

8. A semiconductor unit comprising:

a circuit board having terminal electrodes on a surface; and a semiconductor device having an electrode pad on a first surface, said semiconductor device being mounted facedown on said surface of said circuit board, a plurality of bumps for electrically connecting said electrode pad to said terminal electrodes of said circuit board being formed on said electrode pad, wherein:

each of said bumps comprises a first bump portion and a smaller second bump portion which is formed on said first bump portion and has a second surface, so as to have a two-stage projecting shape, each of said bumps has a plurality of irregularities having concave portions defined on said second surface of said second bump portion, said terminal electrodes have another plurality of irregularities having concave portions extending in various directions, and a bonding layer is formed between said second bump portion and said terminal electrode;

wherein said bonding layer includes conductive particles, and the conductive particles and a part of the bonding layer enter said concave portions of the plurality of irregularities of the bumps and the terminal electrodes.

9. A semiconductor unit according to claim 8, wherein said bonding layer is made of a conductive adhesive.

10. A semiconductor unit according to claim 8, wherein said bonding layer is made of anisotropic conductive material.

11. A semiconductor unit according to claim 8, wherein said plurality of irregularities on said bumps have a width of 0.1 to 10 $\mu$m.

12. A semiconductor unit according to claim 8, wherein said plurality of irregularities on said terminal electrodes have a width of 0.1 to 10 $\mu$m.

13. A semiconductor unit according to claim 8, wherein said bonding layer is made of a conductive adhesive, and said conductive adhesive comprises conductive particles having an average size of about 1 $\mu$m.

14. A semiconductor unit according to claim 13, wherein said conductive particles are made of at least one conductive material selected from the group consisting of AgPd, Au, Cu, and Ag.

* * * * *

UNITED STATES PATENT AND TRADEMARK OFFICE
CERTIFICATE OF CORRECTION

PATENT NO.   : 6,088,236
DATED        : July 11, 2000
INVENTOR(S)  : Tomura et al.

Page 1 of 1

It is certified that error appears in the above-identified patent and that said Letters Patent is hereby corrected as shown below:

<u>Title page, item [56],</u>
References Cited, insert:

U.S Patent Documents
-- 5,014,111    5/1991     Tsuda et al.
3,698,075      10/1972    Boyle
3,995,845      12/1976    Scheffer
5,090,119      2/1992     Tsuda et al.
4,622,098      11/1986    Ochiai et al.
5,108,950      4/1992     Wakabayashi et al. --

FOREIGN PATENT DOCUMENTS
-- 2-34949     2/1990     Japan
62-285446     12/1987    Japan
62-154648     7/1987     Japan --

OTHER DOCUMENTS
-- "Semiconductor Chip Technique", IC Mounting Technique, January 15, 1980 --

Signed and Sealed this

Second Day of October, 2001

Attest:

NICHOLAS P. GODICI
Attesting Officer       Acting Director of the United States Patent and Trademark Office